United States Patent
Stearns et al.

(10) Patent No.: US 7,022,435 B2
(45) Date of Patent: Apr. 4, 2006

(54) METHOD FOR THE MANUFACTURE OF PHASE SHIFTING MASKS FOR EUV LITHOGRAPHY

(75) Inventors: Daniel G. Stearns, Los Altos, CA (US); Donald W. Sweeney, San Ramon, CA (US); Paul B. Mirkarimi, Sunol, CA (US); Anton Barty, Livermore, CA (US)

(73) Assignee: EUV Limited Liability Corporation, Santa Clara, CA (US)

( * ) Notice: Subject to any disclaimer, the term of this patent is extended or adjusted under 35 U.S.C. 154(b) by 54 days.

(21) Appl. No.: 10/256,454

(22) Filed: Sep. 27, 2002

(65) Prior Publication Data

US 2004/0062999 A1  Apr. 1, 2004

(51) Int. Cl.
*G01F 9/00* (2006.01)

(52) U.S. Cl. .......................................................... 430/5

(58) Field of Classification Search .................... 430/5, 430/322; 378/35
See application file for complete search history.

(56) References Cited

U.S. PATENT DOCUMENTS

| | | | | |
|---|---|---|---|---|
| 5,503,950 A | * | 4/1996 | Miyake et al. | 430/5 |
| 6,645,679 B1 | * | 11/2003 | La Fontaine et al. | 430/5 |
| 6,821,682 B1 | * | 11/2004 | Stearns et al. | 430/5 |
| 2003/0190532 A1 | * | 10/2003 | Yan | 430/5 |

* cited by examiner

*Primary Examiner*—S. Rosasco
(74) *Attorney, Agent, or Firm*—John P. Wooldridge; Alan H. Thompson

(57) ABSTRACT

A method for fabricating an EUV phase shift mask is provided that includes a substrate upon which is deposited a thin film multilayer coating that has a complex-valued reflectance. An absorber layer or a buffer layer is attached onto the thin film multilayer, and the thickness of the thin film multilayer coating is altered to introduce a direct modulation in the complex-valued reflectance to produce phase shifting features.

16 Claims, 4 Drawing Sheets

METHOD FOR THE MANUFACTURE OF PHASE SHIFTING MASKS FOR EUV LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the production of phase shifting masks for extreme ultraviolet lithography (EUVL), and more specifically, it relates to systems and methods for directly writing patterns into the reflective multilayer coating of an extreme ultraviolet lithography phase shifting mask and providing a patterned absorber layer onto the EUVL mask.

2. Description of Related Art

Phase shifting masks (also known as reticles) are commonly used as a resolution enhancement technique in optical lithography and the technology is well established and widely used in deep ultra-violet lithography systems. See U.S. Pat. No. 5,045,417, Okamoto et al., titled "Mask For Manufacturing Semiconductor Device And Method Of Manufacture Thereof" issued 1991. Current DUV masks are transmissive and are designed to alter both the phase and amplitude of the transmitted light. In particular, the alternating phase shifting mask (alt-PSM) has been developed to extend the resolution limit of DUV optical systems. The fundamental quantity of interest in determining lithographic resolution is the normalized image line slope (NILS) as this is what determines the sharpness of the lines that can be printed. A common factor used to estimate the smallest printable feature size is the $k_1$ factor of the printing process. For a printing system of a given numerical aperture (NA) operating at a given wavelength ($\lambda$) the critical dimension (CD) is given by:

$$CD = k_1 \frac{\lambda}{NA}.$$

A lower CD means the ability to print smaller lines, and a smaller value of $k_1$ means that smaller lines can be printed on the same optical system. The factor $k_1$ is dependent on the design of the mask used. See U.S. Patent Application No. US2001/0021475, 2001, titled "Lithography Method And Lithography Mask" to Czech et al. For binary transmission masks, $k_1$ lies in the range of 0.5 to 0.7 (the Rayleigh limit of resolution). Halftone masks enable $k_1$ to be reduced to values of 0.38 to 0.55, whilst phase shift masks enable $k_1$ to lie in the range of 0.2 to 0.38.

Phase shift masks can improve the CD specification in a number of ways. These include, but are not limited to:

1. Direct resolution enhancement By taking advantage of both intensity and phase modulation, it is possible to control more of the complex number space defining the optical wave-field leaving the mask, and therefore increase the information content of the light field. This can be used to directly reduce the $k_1$ factor, thus, the printable feature size.

2. If $k_1$ can be improved, it is possible to reduce the NA for a given CD specification. High NA optics are generally larger and harder to fabricate than low NA optics, thus improving $k_1$ through phase shifting enables the specifications on the size and NA of the optics to be relaxed for a given CD specification, thereby reducing the cost of fabricating the optics set.

3. Maintaining the CD specification by reducing $k_1$ and moving to a lower NA also increases the process window. Lower NA optics have a greater depth of focus, thus the focusing tolerances in the wafer plane are relaxed and it is possible to use more economical stages to scan the wafer.

4. Flare control: Flare in the wafer plane can vary as the mask is scanned due to variations in feature density on the mask, with the flare variation affecting contrast in the image plane and, thus, minimum feature resolution. The addition of superfluous phase and amplitude features to the mask can be used to control this.

Although the concept of a phase shifting mask can be directly extended to EUV lithography, the existing technologies for making DUV phase shifting masks are not compatible with EUV mask technology. An EUV mask consists of a thick opaque substrate coated with a reflective multilayer film, on top of which is deposited an absorption layer. The absorption layer is patterned to produce regions that either allow or block reflections from the underlying multilayer coating. This is fundamentally different from the transmissive masks currently used in DUV lithography, and the technology for producing phase shifts in the DUV masks cannot be directly applied to reflective EUV masks.

The development of a new technology for the production of EUV phase shifting masks, such as the technique described in this ROI, would enable direct application of these existing image enhancement techniques to EUV lithography and would find direct application to the printing of smaller CD features using EUV optical systems.

Existing Technologies

With the potential need for phase shifting masks in EUV lithography, several strategies have already been developed for the production of EUV phase shifting masks. These basically fall into three categories: (a) introducing thickness variations by patterning the substrate prior to multilayer coating; (b) depositing phase shifting material on top of the multilayer during the patterning process, and (c) and etching the multilayer to introduce a refractive phase shift into the reflected light.

The first, illustrated in FIG. 1, involves patterning the substrate 10 prior to multilayer coating 12 with an additional layer 14 of well-controlled thickness. Patrick Naulleau et al, LBL, personal communication, October 2001. The multilayer deposited on this raised region of the substrate will reflect at a different phase as compared to the multilayers on the substrate itself, thereby forming a phase shift between the two parts of the pattern. A major drawback of this technique is that it requires patterning of the mask blank prior to deposition of the reflective multilayer, which would require the multilayer coating infrastructure to be incorporated into the patterning process line. This is at odds with the aim of semiconductor manufacturers to source unpatterned, multilayer coated mask blanks form external vendors. Furthermore, the smoothing process which takes place during multilayer deposition, and which is used to reduce the printability of substrate defects, would make the manufacture of sharp phase gradients and phase discontinuities difficult.

The second technique, illustrated in FIG. 2, involves depositing additional material 20, in addition to the absorber material 24 on top of the multilayer stack 22 (on substrate 26) to impart a refractive phase shift on the reflected light. See, for example, Czech et al., "Lithography method and lithography mask", U.S. Patent Application No. US2001/0021475, 2001, p.2. This is analogous to the addition of more glass in transmissive optics to impart a phase shift into the transmitted light. The problem is that at EUV wavelengths the optical constants are not as forgiving as for visible light For example, a 43 nm thick layer of Molybdenum will impart a $\pi$ phase shift on reflected 13.4 nm light, but will also reduce the reflected intensity by a factor of 0.6. Such localized loss of intensity associated with the production of the phase shift is not good when the aim is to produce a purely phase shifting mask, and could cause serious limitations on the practical utility of this approach to phase shifting.

A third technique, illustrated in FIG. 3, involves thinning (30) the multilayer 32 (on substrate 34) in order to impart the desired phase shift The multilayer stack also includes an absorber layer 36. This technique draws on ideas developed for the repair of amplitude defects in which it was shown that milling out craters in a reflective EUV multilayer imparts a refractive phase shift on the reflected light given by $2(2\pi/\lambda)(1-n)h(x)$, where $h(x)$ is the depth profile of the thinned out region, n is the refractive index difference between the media and the additional factor of two is due to reflection causing the light to pass twice through the region of refractive index change. Note that this phase shift is not the same as the phase shift imparted by reflection from the surface of the lowered profile, which would be given by $4\pi h(x)/\lambda$. This is because the interference properties of the multilayer mirror force all wavefronts within the multilayer to be in phase, thus the phase shift imparted on reflection is due solely to refractive effects and not reflection from the top layer of the thinned region. For Mo/Si multilayers, $(1-n) = 0.03$, so for normal incidence it would be necessary to remove 15 bilayers of material to achieve a phase shift of $\pi$ in the reflected light. If there are sufficient bilayers in the multilayer before thinning takes place, this reduction in the number of layers will have little effect on the reflected intensity (subject of course to the terminating material, for example Mo rather than Si, not having absorption properties of its own). However there are significant problems with this idea:

1. The phase shifting features would be high aspect ratio trenches. Take the case of dense 1:1 features having a minimum feature size of 20 nm at the wafer. For a 4× magnification optical system the feature size on the mask would be 80 nm. The phase shifting trenches would be etched between every other feature, and would need to be less than 80 nm wide and 100 nm deep. This would be difficult to achieve cleanly in the multilayer without damaging the layers or getting undesired edge effects from the finite resolution of the ion mill.

2. The interaction of the radiation with the phase shifting features would be complicated, and would certainly include some diffraction from the side walls. This could lead to undesirable modulations of the aerial image that would be difficult to control.

SUMMARY OF THE INVENTION

It is an object of the present invention to phase shifting mask and a method for fabricating a phase shifting mask for EUV lithography.

It is another object to enhance the printability of a reflection mask consisting of a patterned absorber layer deposited on a reflective multilayer coating.

These and other objects will be apparent based on the disclosure herein.

The invention is a phase shifting mask and a method for fabricating a phase shifting mask for EUV lithography. The principle is to enhance the printability of a reflection mask consisting of a patterned absorber layer deposited on a reflective multilayer coating by producing a phase shift between the fields reflected on either side of a critical feature, as shown in FIG. 4. A multilayer stack 40 on a substrate 42 includes a patterned absorber layer 44. Layer contraction is produced, e.g., at 46 by localized heating.

The strategy of applying a pi phase shift across a critical feature reduces $k_1$ and extends the resolution of the imaging process well beyond the Raleigh diffraction limit. Other potential advantages derived from using the phase shift strategy include (1) reducing the required numerical aperture, which increases the depth of focus and decreases the manufacturing cost of the optical system, and (2) increasing the NILS of the aerial image, which increases the process latitude and makes the exposure less sensitive to flare. However, the methods used to produce phase shifting masks in DUV lithography do not readily extend to EUV lithography due to the fundamental change from the transmission to the reflection mode of operation. This invention consists of a process for producing a spatially varying phase shift in a EUV mask by locally modifying the structure of the reflective multilayer coating. The multilayer structure is modified by exposing the mask to a high-resolution thermal source such as an electron beam. The energetic beam causes thermally activated interdiffusion in the reflective multilayer coating, producing a contraction of the layers that results in a local phase shift with no appreciable loss of reflectivity. This process can be applied to the mask as a last step, after the patterning of the absorber layer, which has the advantage of being able to use the absorber pattern for alignment.

DETAILED DESCRIPTION OF THE INVENTION

The invention described herein is compatible with the manufacture of phase shifting reflective EUV masks in which all steps can be accomplished as a part of the patterning process. U.S. patent application Ser. No. 09/669,390, filed Sep. 26, 2000, titled "Repair Of Localized Defects In Multilayer-Coated Reticle Blanks For Extreme Ultraviolet Lithography" is incorporated herein by reference. U.S.

patent application Ser. No. 09/752,887, titled "A Method For Fabricating Reticles For EUV Lithography Without The Use Of A Patterned Absorber" is incorporated herein by reference.

Embodiments of the present invention specifically contemplate the use of this technique on Mo/Si multilayers in which the heating is caused by a focused, energetic electron beam. However, the technique could be applied to multilayers made of other material, in which case the layer contraction described here could take the form of expansion. Furthermore, although the following description is directed to the use of an electron beam for the heating, it should be pointed out that the technique relies only on the heating, and the use of other heat sources to write the phase pattern might be possible. For the purposes of simplicity, however, consider the specific example of a Mo/Si multilayer heated using a focused electron beam. This serves to make the discussion more directed and enables the use of concrete examples to describe the technique.

Figure 1:
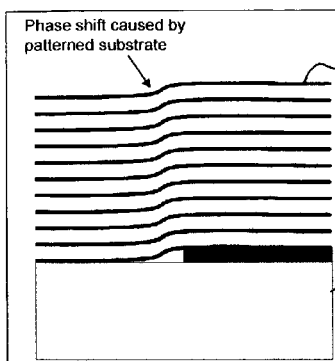
FIG. 1 shows the prior art patterning of a substrate prior to multilayer coating.
Figure 2:
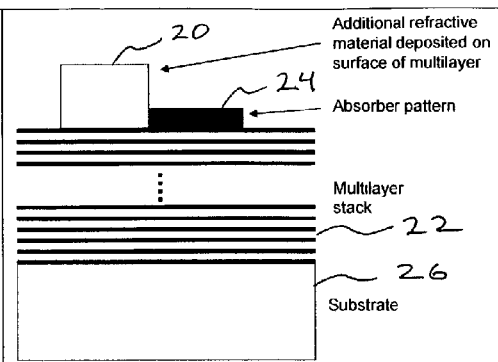
FIG. 2 shows the prior art deposition of additional material on top of the multilayer stack to impart a refractive phase shift on the reflected light.
Figure 3:
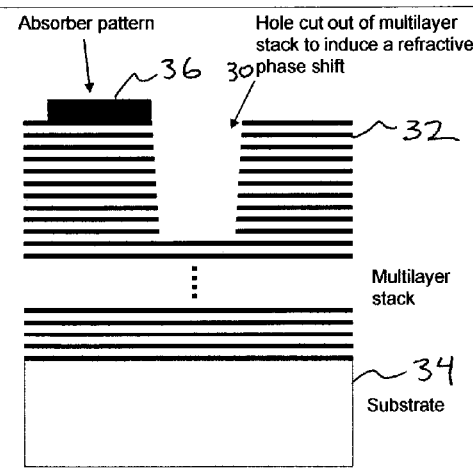
FIG. 3 shows the prior art technique of thinning a multilayer in order to impart a desired phase shift.
Figure 4:
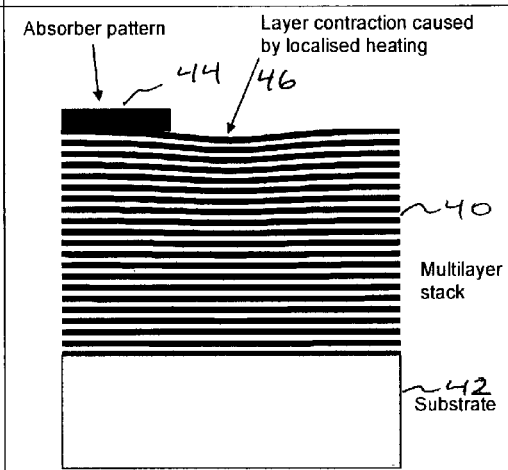
FIG. 4 illustrates the phase shift technique of the present invention, in which localized heating is used to induce local contraction in the multilayer period, resulting in a phase shift in the reflected light.
Figure 5:
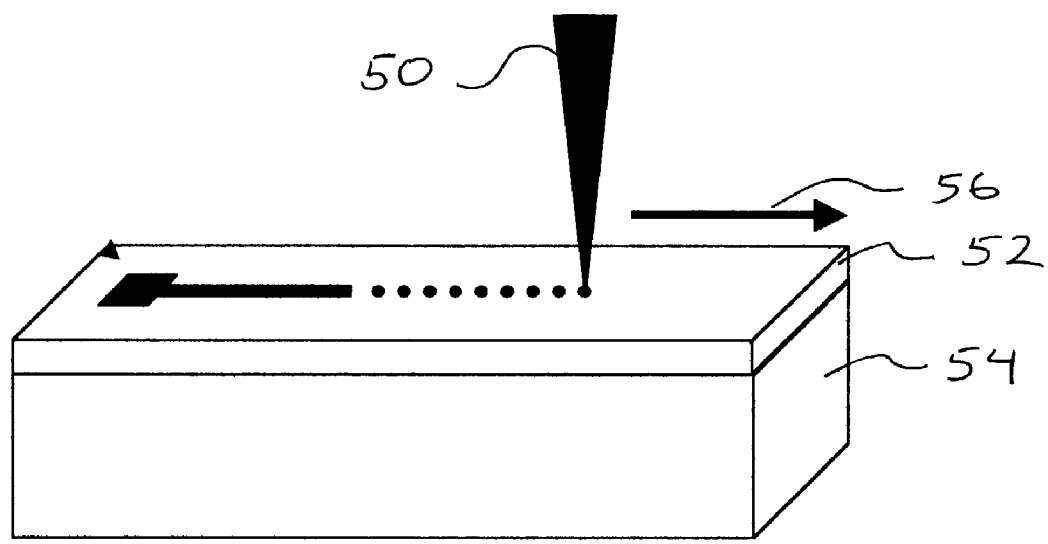
FIG. 5 shows a schematic representation of the production of the arbitrary phase patterns using a high-resolution electron beam to heat the multilayer to activate silicide formation at the Molybdenum/Silicon multilayer interfaces.

The present method, as illustrated schematically in FIG. 5, contemplates the production of the arbitrary phase patterns using a high-resolution electron beam 50 to heat the multilayer 52 (on substrate 54) to activate silicide formation at the Molybdenum/Silicon multilayer interfaces. Because the silicide layer is denser than either Mo or Si alone, growth of the silicide leads to contraction of the multilayer in the regions where the silicide has been formed, and this contraction in turn alters the position of the reflective layers within the multilayer. The phase of the reflected light is determined by the location of the Mo layers, thus displacing one part of the multilayer relative to another causes a shift in the relative phase shift of the reflected light. In the case of defect repair, this contraction is used to restore the phase of the distorted multilayer to reduce the defect printability; conversely, the same strategy can be used to induce a deliberate phase shift in the reflected light in order to produce printable features. That is to say, the phase shifting properties of layer contraction can be used to produce a programmable phase pattern in the reflected light. As shown in the figure, a point beam produces a dot and a scanned beam produces a line or area phase shifts. The beam is scanned in the direction 56.

Silicide growth at the Mo/Si interfaces is essentially an activated process limited by thermal interdiffusion. See R. S. Rosen et al., (1993) 32 Appl. Opt. 6975.

Silicide growth is understood and can be modeled as following the relationship $$w^2 = w_o^2 + 2Dt$$

where $w_o = 1.0$ nm is the starting thickness of the $MoSi_2$ interface layers in deposited Mo/Si multilayers and the interdiffusion coefficient is given by $$D = D_o e^{-E_a/kT}$$

where $D_o = 50$ cm$^2$/S and $E_A = 2.4$ eV for multilayer films. The formation of the silicide leads to densification, which in turn causes contraction of the multilayer period. That change in period is given by $$\delta\Lambda = \Lambda_o - \alpha(w - w_o)$$

where $\alpha = 0.39$ is the contraction factor, the value of which depends on the particular silicide compound formed. See D. G. Stearns, "High-Performance Multilayer Mirror For Soft X-Ray Projection Lithography", Proc. Soc. Photo-Opt. Instrum. Eng., San Diego, 1991, p.2.

It can be seen from these equations that the silicide layer growth has an approximately square root dependence on the time the multilayer is subjected to heating, which is herein referred to as the exposure time. For a given electron beam, it is possible to model the energy deposition and, thus, the heating caused in the sample. From this it is relatively straightforward to compute the rate of silicide formation using the above equations and from that, compute the layer contraction profile. Given that the heating time and/or strength can be readily controlled, it is therefore possible to controllably deform the multilayers and, hence, write arbitrary phase patterns directly into the multilayer film.

Figure 6:
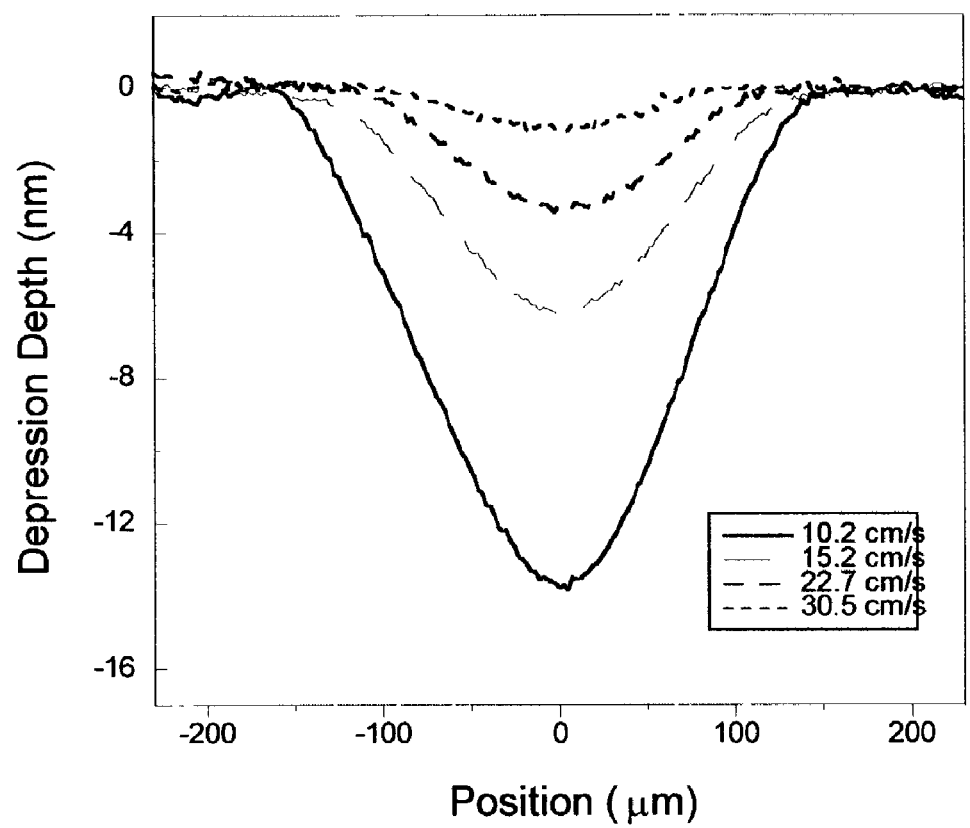
FIG. 6 shows a simulation of the multilayer contraction resulting from a 35 ms exposure to an electron beam of $r_o = 150$ nA at 10 kV.

For example, FIG. 6 shows a simulation of the multilayer contraction resulting from a 35 ms exposure to an electron beam of $r_o = 150$ nA at 10 kV. Note that the top-layer depression is 6 nm, but that this depression is distributed over a number of layers so that the maximum individual layer contraction is $\delta\Lambda = 0.2$ nm. This assures that the repair affects primarily the phase of the reflected field whilst not adversely affecting the reflectance curve. Note, however, that there is no practical limit to the scale over which the phase shift may be affected, thus it is possible to produce large phase shifted regions if necessary. This could be achieved by either scanning a small beam over the sample to write a pattern, or by using a larger electron beam to heat more of the sample. At the other end of the scale, the smallest feature size that could be written is determined by restrictions on electron beam spot size and current imposed by the physics of electron beam interactions in column design.

Figure 7:
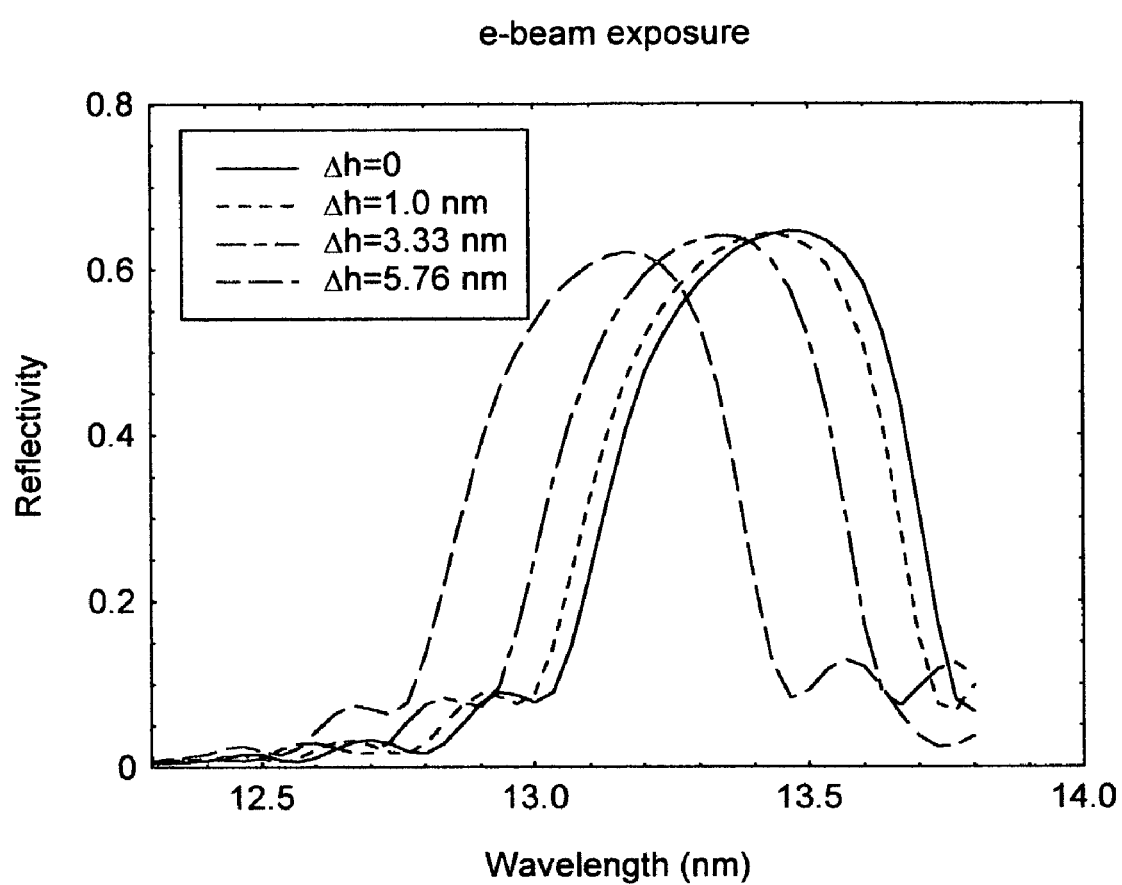
FIG. 7 is an example of the surface profile modification caused by electron beam heating.

An example of the surface profile modification caused by electron beam heating is shown in FIG. 7. In this case a multilayer consisting of 40 bilayer pairs of alternating Mo and Si with a bilayer period of 7.0 nm was deposited on a 1"×¼" fused silica substrate, and then irradiated with 12 keV electrons at a beam current of 0.8 mA in a beam radius of 500 μm $e^{-2}$ radius. To vary the dose, the electron beam was scanned at various scan speeds and the resultant multilayer profile observed. The results of this experiment are shown in FIG. 7. A clean trench was formed by the electron beam and the depression depth was readily controlled by varying the dose (in this case the scan speed).

As described above the strategy of the repair is to use the layer contraction induced by the local heating to cause a depression in the multilayer. However, it is evident from inspection of FIG. 6 that the electron beam heating does not produce a uniform displacement throughout the film—the layer displacement increases with depth from the surface. Hence, the desired profile is produced at a single chosen depth; the layers above this will have slightly more displacement and the layers below will have slightly less. As the goal is to produce a desired phase structure, the depth at which the amplitude of the reflected field is divided into two equal parts is chosen as the depth at which to effect the desired layer profile. The reflected field from the layers above this depth will have slightly retarded phase whilst the field from the layers below will have slightly advanced phase, and the contribution from the two will, on average, cancel out in the total reflected field. The actual depth of this layer is chosen by considering the number of layers required to obtain half the reflected amplitude (one quarter of the reflected intensity) of the entire multilayer coating. For Mo/Si multilayers this turns out to be the $7^{th}$ bilayer from the top surface, thus we choose to make the $7^{th}$ layer have the depression profile necessary to produce the desired phase structure.

It is also necessary to consider the effect of layer contraction on the multilayer reflectance curve to ensure that the multilayer reflectivity is not moved too far out from the bandpass of the optics. To investigate this, the reflectance profile of the phase-shifted multilayers was measured and is shown in FIG. 7. The multilayer contraction does cause a slight shift in the wavelength as expected, and also causes a slight decrease in reflectivity associated with the formation of additional $MoSi_2$ at the multilayer interfaces.

In viewing this data is must be remembered that change in the reflectance curve, as measured by the wavelength at which the reflectivity peaks, is a direct consequence of the individual layer contraction, and that the individual layer contraction required to produce a given phase shift will decrease as the number of layers contracted increases. Given that most of the reflection occurs within the top few layers the amount of wavelength shift could therefore be reduced by increasing the number of bilayers participating in the contraction. Modeling of electron beam heating at energies of 12–16 kV indicates that the majority of the heating, and therefore the majority of layer contraction, will take place within the top 20 bilayers. However if a heat source can be found which could provide more uniform heating through the depth of the multilayer, the amount of wavelength shift could be reduced—the greater the number of layers participating in the contraction the smaller the shift in peak reflectivity caused by introducing a given phase shift.

Note also that phase shift masks in which the phase shifting material introduces some attenuation are not new to the field. See, for example, U.S. Pat. No. 5,928,281, titled "Attenuated Phase Shift mask", Krivokapic et. al., issued 1999. Thus, there are existing technologies that can handle or compensate for the effect of attenuation that might be introduced into the phase shifted regions.

The present invention is not limited to electron beam heating. The layer contraction effect can be produced by any form of localized heating. The example of electron beam heating is an example of an embodiment of the technique. Other embodiments can be carried out using, e.g., an electromagnetic beam or an ion beam The scope of the claims is limited to any one type of phase shifting mask (for example the alternating phase shift mask, commonly referred to as alt-PSM). The technique can be used to produce controllable phase structures on masks for any purpose and is not limited to any one particular embodiment of phase shift mask technology.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method for fabricating an EUV phase shift mask, comprising:
   providing a substrate;
   depositing a thin film multilayer coating onto said substrate, wherein said thin film multilayer coating comprises a complex-valued reflectance, wherein said thin film multilayer coating comprises alternate molybdenum and silicon layers;
   attaching a layer onto said thin film multilayer, wherein said layer is selected from the group consisting of an absorber layer and a buffer layer; and
   changing the thickness of said thin film multilayer coating to introduce a direct modulation in said complex-valued reflectance to produce phase shifting features, wherein the step of changing the thickness is produced by localized heating of a portion of said multilayer thin film coating to a temperature of 800–1000 K for a controlled period of time to activate suicide formation at interfaces between layers of the molybdenum and silicon.

2. The method of claim 1, wherein the step of changing the thickness is carried out after the step of attaching a layer.

3. The method of claim 1, wherein the step of changing the thickness is carried out before the step of attaching a layer.

4. The method of claim 1, wherein the step of changing the thickness is carried out by directing localized irradiation onto said multilayer thin film coating to produce a density change therein causing localized displacement of a portion of said multilayer thin film coating in a direction normal to the layer planes.

5. The method of claim 1, wherein said localized heating is produced by irradiation with an electron beam.

6. The method of claim 5, further comprising optimizing the voltage and current parameters of said electron beam to maximize heating through the bulk of said multilayer thin film coating while minimizing heating of said substrate.

7. The method of claim 1, wherein the step of changing the thickness is carried out using electron beam heating in which the electron beam energy is in the range of 3–30 keV.

8. The method of claim 1, wherein the step of changing the thickness is carried out with an electron beam used to locally heat a multilayer of at least 40 bi-periods in such a way as to depress the topmost surface no further than two bilayers deep.

9. The method of claim 1, wherein said thin film multilayer coating comprises a bi-layer period in the range of 5–8 nm, wherein the step of changing the thickness produces a surface depression that is no more than 16 nm deep.

10. The method of claim 1, further comprising minimizing the change in reflectivity and wavelength produced by the step of changing the thickness.

11. The method of claim 1, wherein the step of changing the thickness includes scanning a localized heat source over the surface of said thin film multilayer coating.

12. The method of claim 1, wherein the step of changing the thickness includes projecting a heating source onto said substrate using an imaging system.

13. The method of claim 1, further comprising controlling the spatial distribution and magnitude of said phase shifting features.

14. The method of claim 1, wherein the region over which said phase shifting features are produced is within a range from (i) that which can be produced with electron optics to (ii) the entire area of said thin film multilayer coating.

15. An EUV phase shift mask, comprising:
   a substrate;
   a thin film multilayer coating fixedly attached to said substrate, wherein said thin film multilayer coating comprises a complex-valued reflectance, wherein said thin film multilayer coating comprises alternate molybdenum and silicon layers; and
   a layer attached onto said thin film multilayer, wherein said layer is selected from the group consisting of an absorber layer and a buffer layer,
   wherein the thickness of said thin film multilayer coating comprises a variation that introduces a direct modulation in said complex-valued reflectance to produce phase shifting features, wherein said variation is the result of silicide formation at interfaces between layers of the molybdenum and silicon.

16. The EUV phase shift mask of claim 15, wherein said thin film multilayer coating comprises a bi-layer period in the range of 5–8 nm, wherein said thickness variation comprises a surface depression that is no more than 16 nm deep.

* * * * *